(12) United States Patent
Boerstler

(10) Patent No.: US 6,963,628 B2
(45) Date of Patent: Nov. 8, 2005

(54) MULTIPHASE RETIMING MECHANISM

(75) Inventor: David William Boerstler, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 793 days.

(21) Appl. No.: 09/820,507

(22) Filed: Mar. 29, 2001

(65) Prior Publication Data

US 2002/0141526 A1 Oct. 3, 2002

(51) Int. Cl.$^7$ ................................................ H03L 7/00
(52) U.S. Cl. ..................................... 375/373; 327/146
(58) Field of Search ................................. 375/326, 327, 375/371, 373, 376; 370/516, 518; 327/144, 146, 147

(56) References Cited

U.S. PATENT DOCUMENTS

| | | | | |
|---|---|---|---|---|
| 5,127,023 A | * | 6/1992 | Tash et al. | 375/282 |
| 5,509,037 A | * | 4/1996 | Buckner et al. | 375/371 |
| 5,850,422 A | * | 12/1998 | Chen | 375/371 |
| 5,887,040 A | * | 3/1999 | Jung et al. | 375/372 |
| 6,031,886 A | * | 2/2000 | Nah et al. | 375/375 |
| 6,107,946 A | | 8/2000 | Jeong | 341/101 |
| 6,211,741 B1 | * | 4/2001 | Dalmia | 331/11 |
| 6,331,999 B1 | * | 12/2001 | Ducaroir et al. | 375/226 |
| 6,417,698 B1 | * | 7/2002 | Williams et al. | 326/93 |

OTHER PUBLICATIONS

"Transceiver with 2x–Oversampling and Transmit Signal Pre–Emphasis," *IEEE International Solid–State Circuits Conference*, 1997, pp. 238–239, 464.
"CMOS Transceiver for Serial Data Communication," *IEEE International Solid–State Circuits Conference*, 1997, pp. 242–243, 465.
"CMOS Transceiver for Serial Data Communication," *IEEE International Solid–State Circuits Conference*, 1995, pp. 32–33, 336.

* cited by examiner

*Primary Examiner*—Young T. Tse
(74) *Attorney, Agent, or Firm*—Robert A. Voigt, Jr.; Winstead Sechrest & Minick P.C.; Casimer K. Salys

(57) ABSTRACT

A system and method for reducing timing uncertainties in a serial data signal. A system may comprise a transmitter configured to transmit serial data to a receiver through a transmission medium. The receiver may comprise a retiming mechanism configured to sample the serial data using a particular phase of a clock at a point in time when the serial data signal may not be likely to experience jitter. The retiming mechanism may comprise a plurality of first units, e.g., flip-flops, where each of the first units is configured to sample the serial data using a particular phase of the clock. Each of the first units may be connected to a particular second unit, e.g., transmission gate. Each of the second units may be configured to output the value of the serial data sampled by the associated first unit upon activation. The data outputted may subsequently become part of the retimed data.

4 Claims, 7 Drawing Sheets

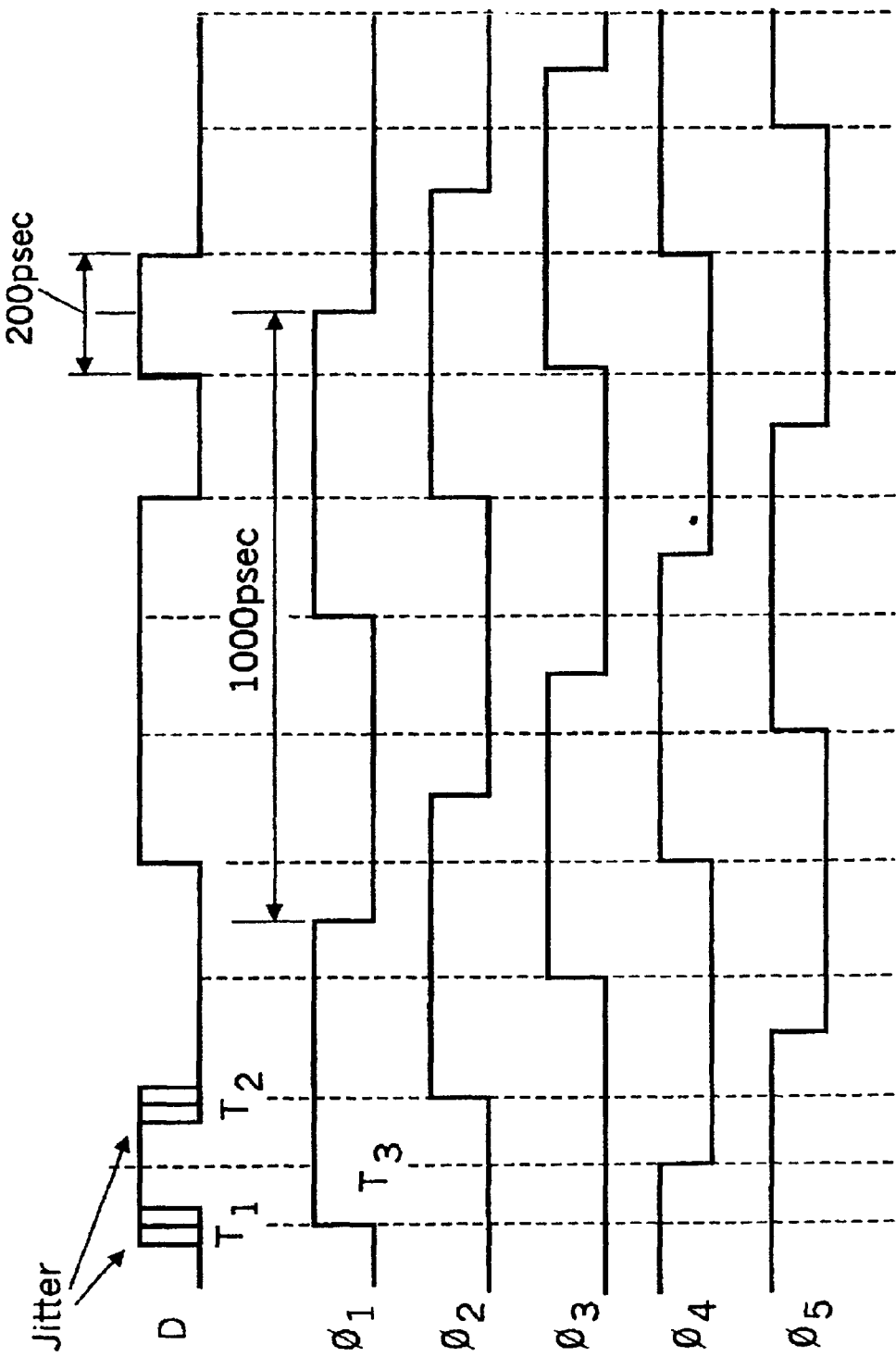

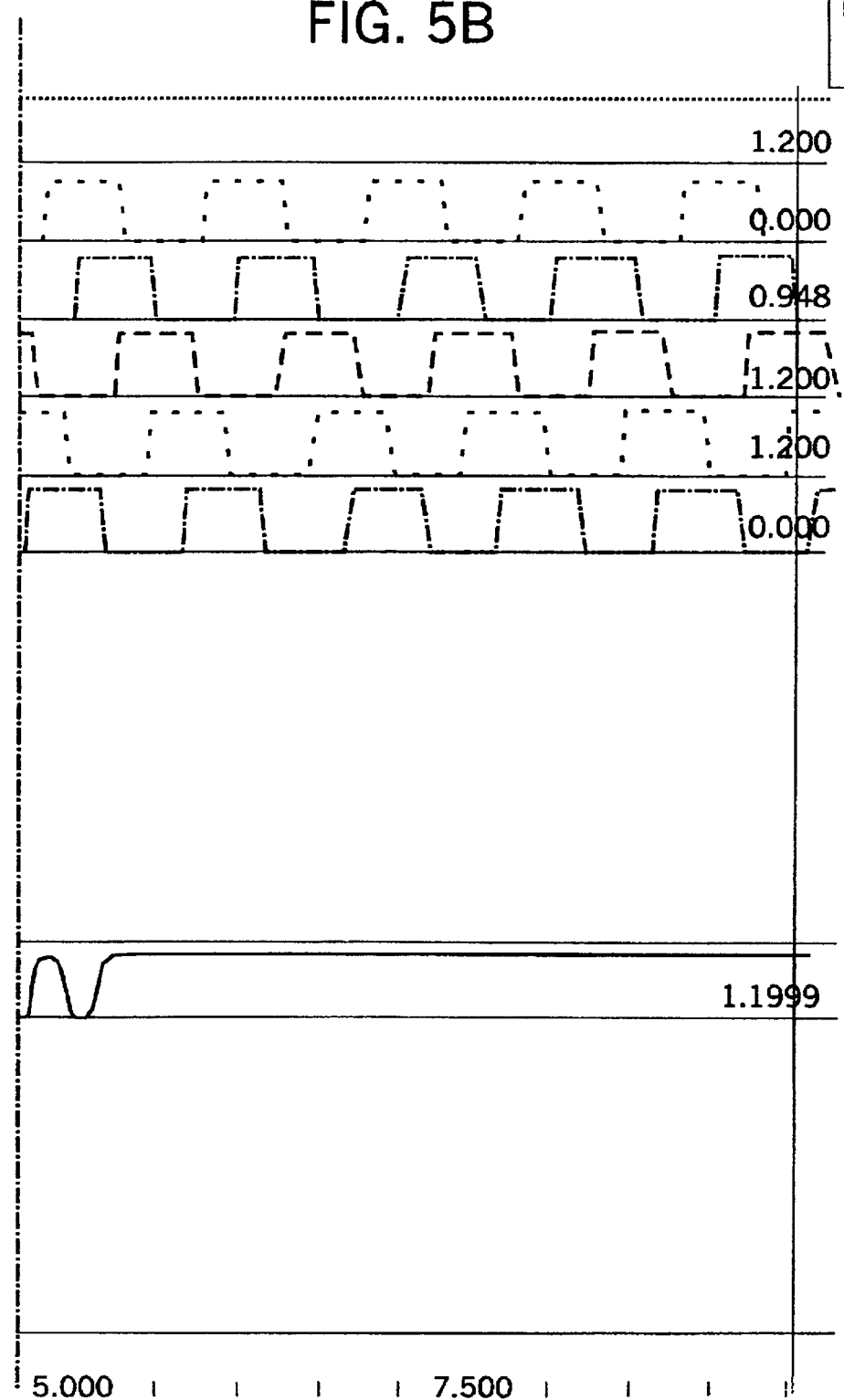

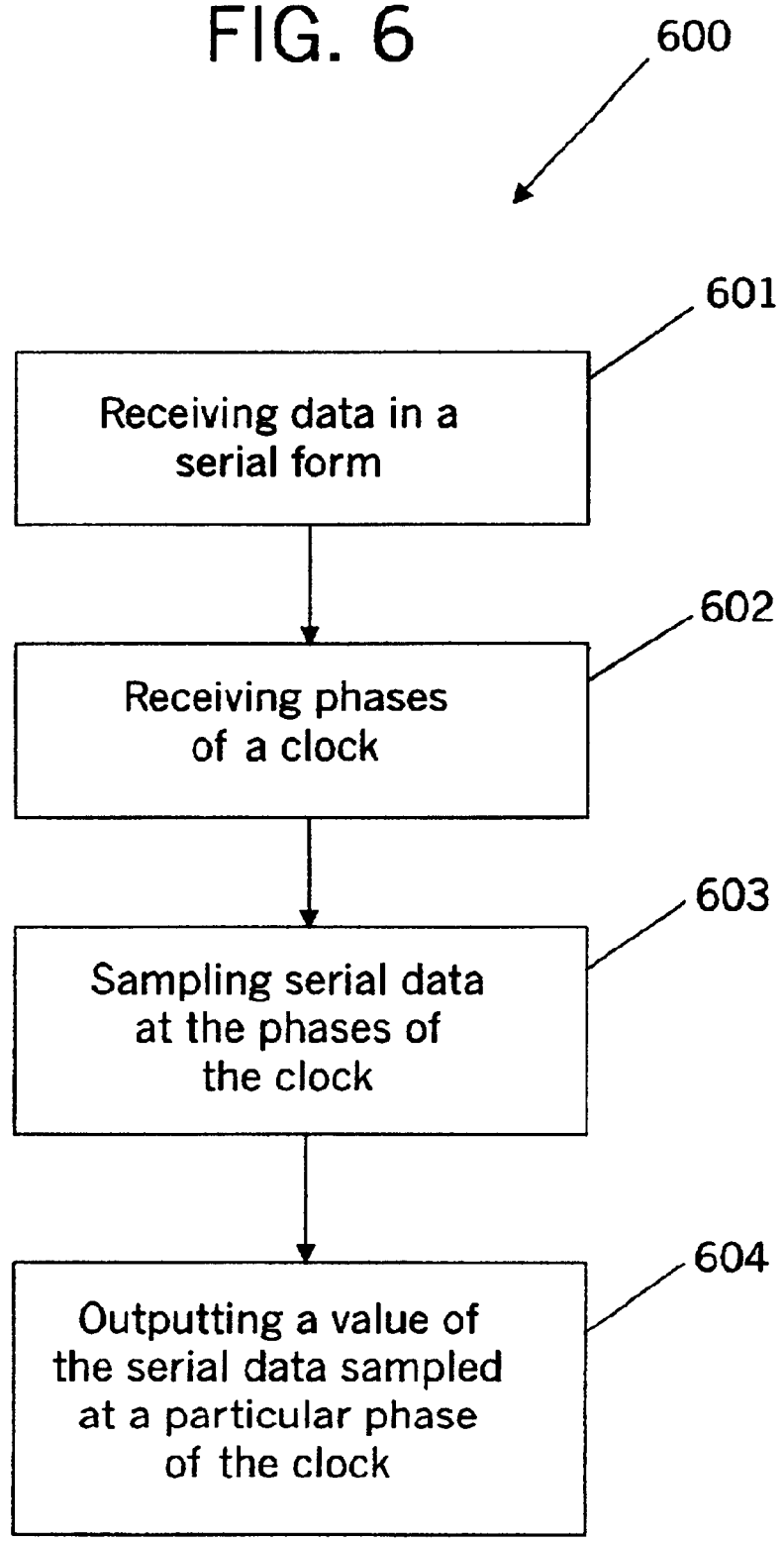

MULTIPHASE RETIMING MECHANISM

CROSS REFERENCE TO RELATED APPLICATIONS

The present invention is related to the following U.S. Patent Applications which are incorporated herein by reference: Ser. No. 09/820,512 entitled "Synchronization State Detector" filed Mar. 29, 2001.

TECHNICAL FIELD

The present invention relates to the field of digital transmission, and more particularly to diminishing jitter in serialized data.

BACKGROUND INFORMATION

As electronic and computer technology continues to evolve, communication of information among different devices, either situated near by or at a distance becomes increasingly important. It is now more desirable than ever to provide high speed communications among different chips on a circuit board, different circuit boards in a system and different systems with each other. It is also desirable to provide high speed communications in intensive data consuming systems using graphical or video information, multiple input-output channels, local area networks, etc.

Data may be transmitted between different devices in a communication system through a "data link". Typically, data is transmitted in parallel whenever possible in order to increase bandwidth. However, due to cost, weight, interference (noise) and electrical loading considerations, parallel transmission is not feasible in many systems. In order to simplify the communications problem, data may be transmitted serially. By transmitting data serially, less hardware is required for the actual communications link between the different devices.

The transmitted serial data signal in the data link may have timing uncertainties as the result of interference, attenuation, skin effect, etc. These timing uncertainties are commonly referred to as "jitter." "Jitter" may refer to an offset of time as to when the serial data signal transitions from a high to a low state or from a low to a high state.

It would therefore be desirable to diminish jitter thereby improving the accuracy of the received serial data signal.

SUMMARY

The problems outlined above may at least in part be solved in some embodiments by reducing the timing uncertainties in the received serial data by a retiming mechanism configured to output a value of the serial data signal sampled at a particular phase of a clock at a point in time when the serial data signal may not be likely to experience jitter.

In one embodiment, a system for reducing timing uncertainties in a serial data signal comprises a transmitter configured to transmit serial data to a receiver through a transmission medium, e.g., wireless, wired. The receiver may comprise an input configured to receive serial data. The receiver may further comprise an oscillator configured to generate phases of a clock. The receiver may further comprise a retiming mechanism configured to receive the serial data as well as the phases of the clock generated by the oscillator. The retiming mechanism may be configured to reduce the timing uncertainties of the serial data by outputting a value of the serial data signal sampled at a particular phase of a clock at a point in time when the serial data signal may not be likely to experience jitter. The retiming mechanism may comprise a plurality of first units, e.g., flip-flops, where each of the first units is configured to sample the serial data using a particular phase of the clock. Each of the first units may be connected to a particular second unit, e.g., transmission gate. Each of the second units may be configured to output the value of the serial data sampled by the associated first unit upon activation. The data outputted by the second units is the retimed data where the retimed data is the serial data with diminished timing uncertainties.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

A better understanding of the present invention can be obtained when the following detailed description is considered in conjunction with the following drawings, in which:

FIG. 3 is a timing diagram illustrating the timing of the serial data and the phases of a clock according to the present invention;

FIGS. 5A–B are a timing diagram illustrating the timing of the serial data, the phases of a clock and the retimed data according to the present invention; and FIG. 6 is a flowchart of a method for reducing timing uncertainties in a serial data signal.

DETAILED DESCRIPTION

Figure 1:
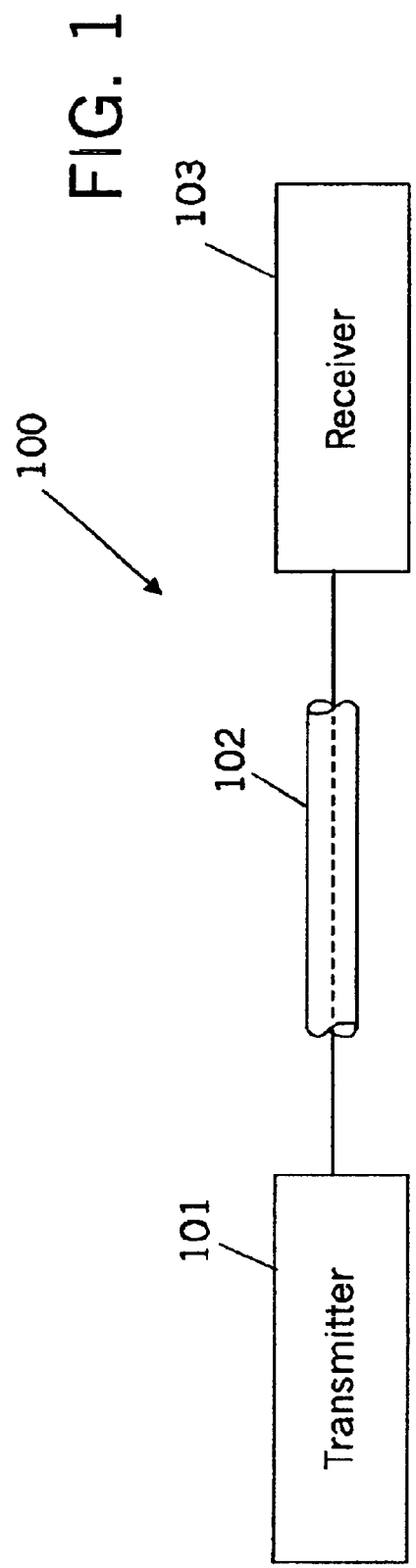
FIG. 1 illustrates an embodiment of the present invention of a serial data link.

FIG. 1—Serial Data Link

FIG. 1 illustrates an embodiment of the present invention of a serial data link 100 used in a communication system. As stated in the Background Information, data may typically be transmitted between various devices in a communication system through a data link. Typically, data is transmitted in parallel whenever possible in order to increase bandwidth. However, due to cost, weight, interference (noise) and electrical loading considerations, parallel transmission is not feasible in many systems. In order to simplify the communications problem, data may be transmitted serially across a serial data link 100 by a transmitter 101. Transmitter 101 may be configured to convert the parallel data to a serial form which may be transmitted through a medium 102, e.g., wired, wireless, to a receiver 103 configured to convert the serial data into parallel form which may then be transmitted to another device, e.g., computer, cellular phone.

FIG. 2—Receiver

Figure 2:
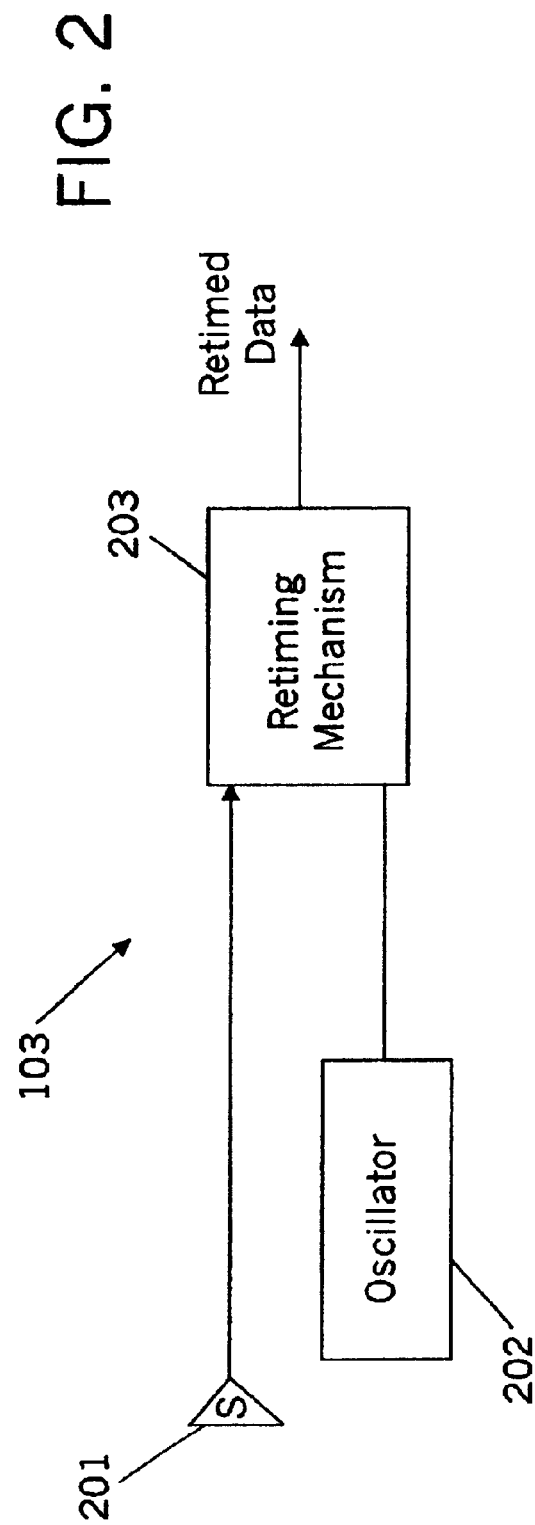
FIG. 2 illustrates an embodiment of a receiver in a serial data link configured in accordance with the present invention.

FIG. 2 illustrates an embodiment of the present invention of a receiver 103 configured to receive serial data 201 transmitted from transmitter 101 through medium 102, e.g., wired, wireless. Receiver 103 may comprise an oscillator 202 configured to generate multiple phases of a clock. In one embodiment, oscillator 202 may be configured to operate at a frequency lower than the serial data rate thereby saving power. In the exemplary embodiment, oscillator 202 may be configured to generate five phases of a clock. It is noted that oscillator 202 may be configured to generate any number of phases of a clock. Serial data 201 as well as the multiple phases of a clock generated by oscillator 202 may be inputted to a retiming mechanism 203. Retiming mechanism 203 may be configured to retime, i.e., diminish jitter, the serial data signal 201 received from transmitter 101 as described with respect to of FIGS. 4–6.

As stated above, the serial data signal 201 generated by transmitter 101 may have timing uncertainties as the result of interference, attenuation, skin effect, etc. These timing uncertainties are commonly referred to as "jitter." "Jitter" may refer to an offset of time as to when the serial data signal 201 transitions from a high to a low state or from a low to a high state as illustrated below.

FIG. 3—Timing Diagram

FIG. 3 is a timing diagram that illustrates the timing of serial data 201 and the phases of a clock generated by oscillator 202. As stated above, in the exemplary embodiment, oscillator 202 generates five phases of a clock which are designated as Ø1, Ø2, Ø3, Ø4 and Ø5.

As stated above, "jitter" may refer to timing uncertainties when the serial data signal 201 transitions from a high to a low state or from a low to a high state. Referring to FIG. 3, the serial data signal 201 experiences jitter at points in time at T1 and T2. That is, the serial data signal 201 experiences an offset of time at a point in time at T1 when the serial data signal 201 transitions from a low state to a high state and experiences an offset of time at a point in time at T2 when the serial data signal 201 transitions from a high state to a low state.

In one embodiment, jitter may be diminished by sampling the serial data signal 201 at a point in time when the serial data signal 201 is not likely to experience jitter. For example, if the serial data signal 201 were sampled during a particular period at a particular point in time, such as at T3, then jitter may be diminished. The serial data signal 201 may be sampled by using an appropriate phase, e.g., Ø1, Ø2, Ø3, Ø4, Ø5, of the clock generated by oscillator 202. For example, the serial data signal 201 may be sampled at the point in time at T3 by using phase Ø4 since the falling edge of phase Ø4 is aligned with the point in time at T3. A retiming mechanism 203 using the phases of the clock generated by oscillator 202 may be configured to sample serial data 201 at a point in time when the serial data signal 201 is not likely to experience jitter, e.g., T3, using an appropriate phase, e.g., Ø4, of the clock as described below.

Figure 4A:
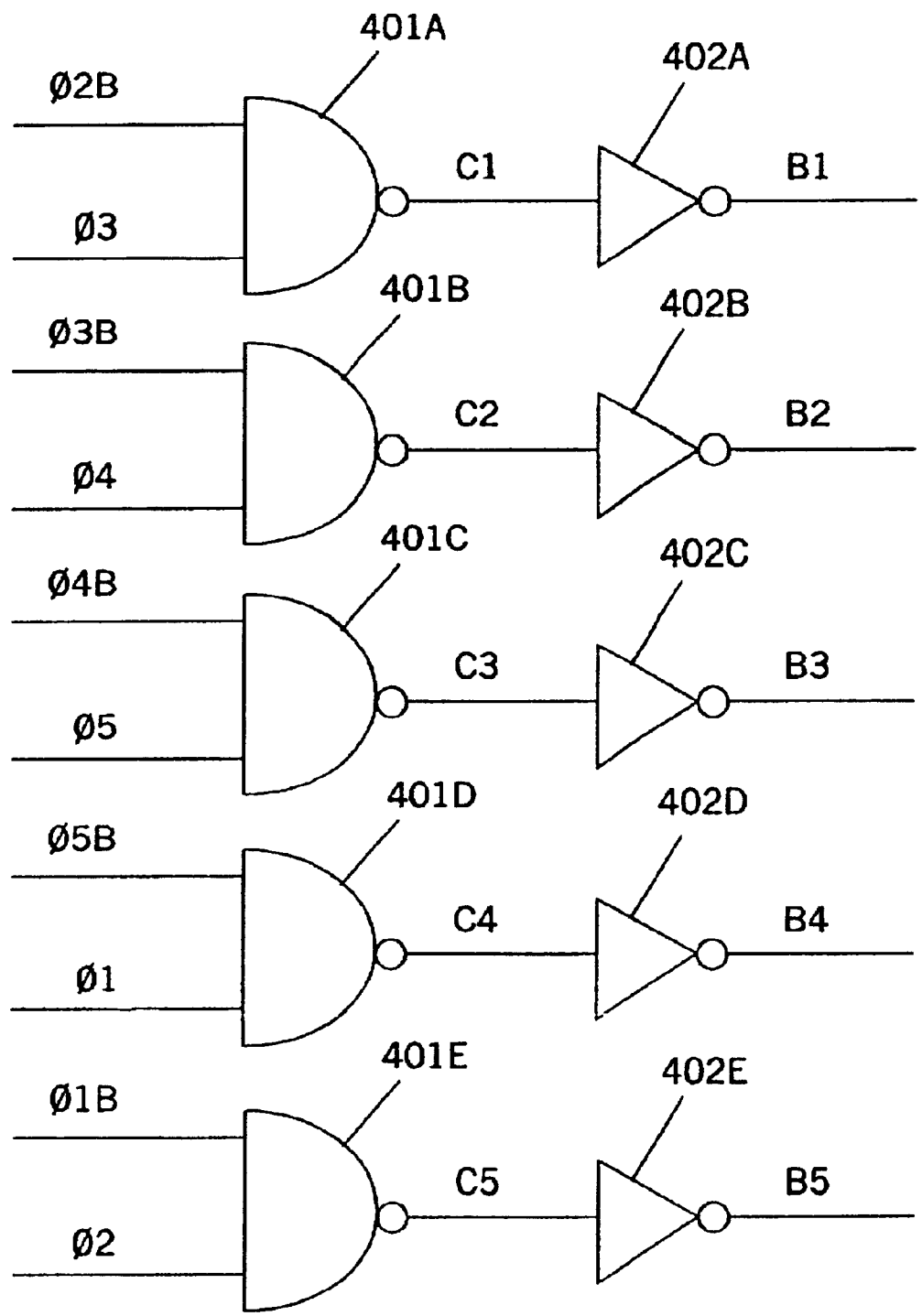
FIGS. 4A and 4B illustrate an embodiment of the present invention of a retiming mechanism.
Figure 4B:
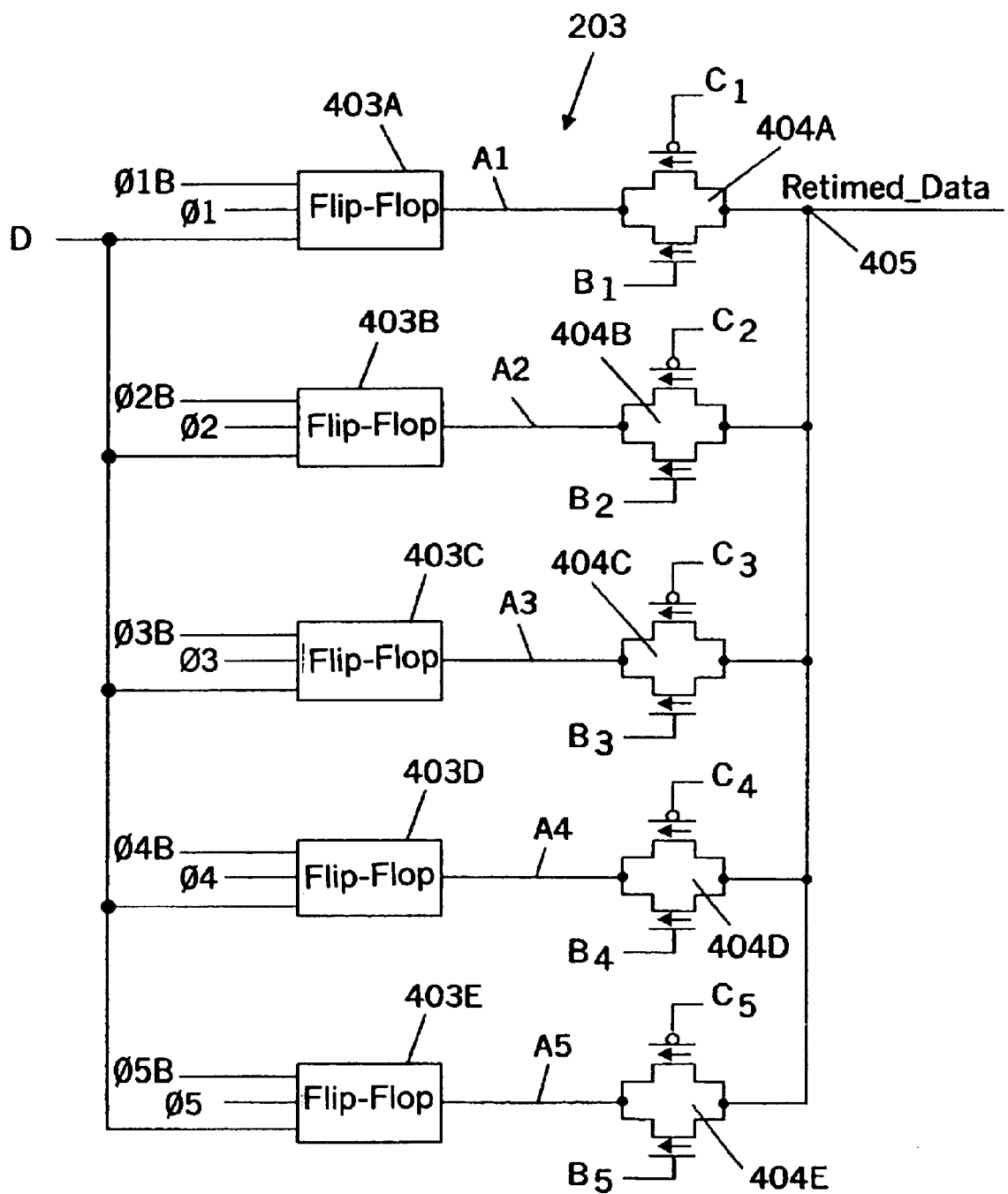

FIGS. 4A and 4B—Retiming Mechanism

FIGS. 4A and 4B illustrate one embodiment of the present invention of retiming mechanism 203 Reffering to FIG. 4B, retiming mechanism 203 may comprise a plurality of flip-flops 403A–E configured to sample serial data 201 at various phases of the clock generated by oscillator 202 as described in further detail below. Flip-flops 403A–E may collectively or individually be referred to as flip-flops 403 or flip-flop 403, respectively. In the exemplary embodiment, flip-flops 403 are D flip-flops. Retiming mechanism 203 may further comprise a plurality of transmission gates 404A–E. A transmission gate may refer to two transistors of opposite types, e.g., p-type, n-type, coupled to one another. Transmission gates 404A–E may collectively or individually be referred to as transmission gates 404 or transmission gate 404, respectively. Referring to FIG. 4A, retiming mechanism 203 may further comprise combinational logic, e.g., plurality of NAND gates 401A–E and a plurality of inverters 402A–E, configured to generate the logical states of the inputs to transmission gates 404A–E. NAND gates 401A–E may collectively or individually be referred to as NAND gates 401 or NAND gate 401, respectively. Inverters 402A–E may collectively or individually be referred to as inverters 402 or inverter 402, respectively. It is noted that retiming mechanism 203 may comprise a different number of flip-flops 403 and a different number of transmission gates and a different number of NAND gates 401 and a different number of inverters 402 corresponding to a different number of phases of the clock generated by oscillator 202 and that FIGS. 4A and 4B are illustrative.

Referring to FIG. 4B, flip-flops 403 are configured to sample serial data 201 at an edge, e.g., negative edge, of a particular phase, e.g., Ø1. For example, flip-flop 403A maybe configured to receive as inputs phase Ø1, the complement of phase Ø1 (Ø1B) and serial data 201 thereby being able to sample serial data 201 using an edge, e.g., negative edge, of phase Ø1. Flip-flop 403B may be configured to receive as inputs phase Ø2, the complement of phase Ø2 (Ø2B) and serial data 201 thereby being able to sample serial data 201 using an edge, e.g., negative edge, of phase Ø2. Flip-flop 403C may be configured to receive as inputs phase Ø3, the complement of phase Ø3 (Ø3B) and serial data 201 thereby being able to sample serial data 201 using an edge, e.g., negative edge, of phase Ø3. Flip-flop 403D may be configured to receive as inputs phase Ø4, the complement of phase Ø4 (Ø4B) and serial data 201 thereby being able to sample serial data 201 using an edge, e.g., negative edge, of phase Ø4. Flip-flop 403E may be configured to receive as inputs phase Ø5, the complement of phase Ø(Ø5B) and serial data 201 thereby being able to sample serial data 201 using an edge, e.g., negative edge, of phase Ø5.

Data sampled by flip-flops 403A–E is outputted to A1–A5, respectively. The data at A1 may be outputted to node 405 if transmission gate 404A associated with flip-flop 403A is activated, i.e., turned on. The data at A2 may be outputted to node 405 if transmission gate 404B associated with flip-flop 403B is activated, i.e., turned on. The data at A3 may be outputted to node 405 if transmission gate 404C associated with flip-flop 403C is activated, i.e., turned on. The data at A4 may be outputted to node 405 if transmission gate 404D associated with flip-flop 403D is activated, i.e., turned on. The data at A5 may be outputted to node 405 if transmission gate 404E associated with flip-flop 403E is activated, i.e., turned on. A particular transmission gate 404, e.g., transmission gate 404C, may be activated based upon the logical states of the inputs as determined by the combinational logic in retiming mechanism, e.g., plurality of NAND gates 401 and a plurality of inverters 402, as described further below.

As stated above, transmission gates 404 may be two transistors of opposite types, e.g., p-type, n-type, coupled to one another. For example, transmission gate 404A may comprise a p-type transistor that receives as input the logical state of C1 and a n-type transistor that receives as input the logical state of B1. Transmission gate 404B may comprise a p-type transistor that receives as input the logical state of C2 and a n-type transistor that receives as input the logical state of B2. Transmission gate 404C may comprise a p-type transistor that receives as input the logical state of C3 and a n-type transistor that receives as input the logical state of B3. Transmission gate 404D may comprise a p-type transistor that receives as input the logical state of C4 and a n-type transistor that receives as input the logical state of B4. Transmission gate 404E may comprise a p-type transistor that receives as input the logical state of C5 and a n-type transistor that receives as input the logical state of B5.

Transmission gate 404 may be activated when the input to the p-type transistor is low and the input to the n-type transistor is high. When that occurs, the output of the flip-flop 403 associated with that transmission gate 404 is outputted to node 405 and subsequently becomes part of the retimed_data, i.e., the data after sampling the serial data signal 201 at a point in time when the serial data signal 201 is not likely to experience jitter. For example, when the logical state of C1 is low and the logical state of B1 is high, the data at A1 is outputted to node 405 and subsequently becomes part of the retimed_data.

As stated above, the logical states of the inputs, e.g., C1–C5, B1–B5, to transmission gates 404 may be generated by the combinational logic, e.g., plurality of NAND gates 401 and a plurality of inverters 402, in retiming mechanism 203. Referring to FIG. 4A, NAND gate 401A generates the logical state of C1 based on the inputs of Ø2B and Ø3 where Ø2B is the complement of the phase Ø2. Subsequently, C1 is low only when both inputs Ø2B and Ø3 are high. In other cases, C1 is high. NAND gate 401B generates the logical state of C2 based on the inputs of Ø3B and Ø4 where Ø3B is the complement of the phase Ø3. Subsequently, C2 is low only when both inputs Ø3B and Ø4 are high. In other cases, C2 is high. NAND gate 401C generates the logical state of C3 based on the inputs of Ø4B and Ø5 where Ø4B is the complement of the phase Ø4. Subsequently, C3 is low only when both inputs Ø4B and Ø5 are high. In other cases, C3 is high. NAND gate 401D generates the logical state of C4 based on the inputs of Ø5B and Ø1 where Ø5B is the complement of the phase Ø5. Subsequently, C4 is low only when both inputs Ø5B and Ø1 are high. In other cases, C4 is high. NAND gate 401E generates the logical state of C5 based on the inputs of Ø1B and Ø2 where Ø1B is the complement of the phase Ø1. Subsequently, C5 is low only when both inputs Ø1B and Ø2 are high. In other cases, C5 is high. The logical states of C1–C5 are inverted by inverters 402A–E to produce the logical states of B1–B5, respectively. The logical states of B1–B5 are complements of the logical states of C1–C5, respectively.

As stated above, a particular transmission gate, e.g., 404C, may be activated based upon the logical states of the inputs as determined by the combinational logic, e.g., plurality of NAND gates 401 and a plurality of inverters 402, in retiming mechanism as illustrated in FIG. 4A.

Figure 5A:
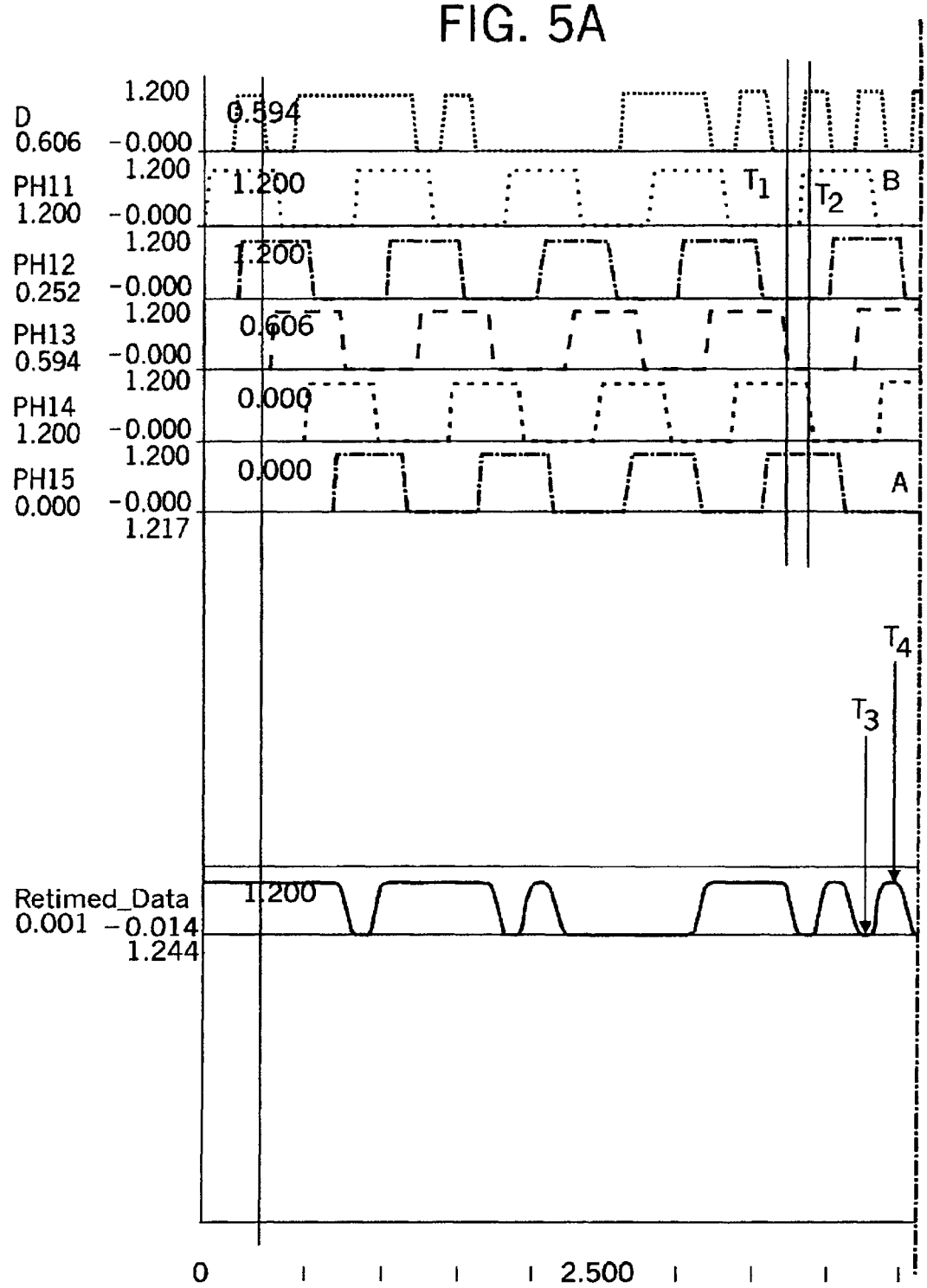

FIGS 5A–B—Timing Diagram

FIGS. 5A–B are a timing diagram that illustrate the timing of serial data 201, the phases of the clock generated by oscillator 202 as well as the retimed data where the retimed data is the serial data signal 201 with diminished timing uncertainties.

For example, at the point in time at T1, phase Ø3 is the appropriate phase to use to sample the serial data signal 201 since the falling edge of phase Ø3 is aligned with the point in time at T1. Referring to FIGS. 4A, 4B, 5A and 5B, when the logical state of phase Ø3 becomes low, flip-flop 403C sampling the serial data signal 201 using phase Ø3 of the clock generated by oscillator 202 outputs the sampled serial data signal 201 to A3. The value of the sampled serial data signal 201 at A3 will be outputted to node 405 when the logical state of C3 is low and the logical state of B3 is high thereby activated transmission gate 404C. The logical state of C3 is low and the logical state of B3 is high when the inputs to NAND gate 401C, Ø4B and Ø5, are both high. That is, the logical state of C3 is low and the logical state of B3 is high when the logical state of phase Ø4 is low and the logical state of phase Ø5 is high. That occurs during the shaded region labeled "A" as illustrated in FIG. 5A. The value of the sampled serial data signal 201 at A3 that was outputted to node 405 upon activation of transmission gate 404C subsequently becomes part of the retimed_data as illustrated in FIG. 5A at the point in time at T3.

At the point in time at T2, phase Ø4 is the appropriate phase to use to sample the serial data signal 201 since the falling edge of phase Ø4 is aligned with the point in time at T2. Referring to FIGS. 4A, 4B, 5A and 5B, when the logical state of phase Ø4 becomes low, flip-flop 403D sampling the serial data signal 201 using phase Ø4 of the clock generated by oscillator 202 outputs the sampled serial data signal 201 to A4. The value of the sampled serial data signal 201 at A4 will be outputted to node 405 when the logical state of C4 is low and the logical state of B4 is high thereby activated transmission gate 404D. The logical state of C4 is low and the logical state of B4 is high when the inputs to NAND gate 401D, Ø5B and Ø1, are both high. That is, the logical state of C4 is low and the logical state of B4 is high when the logical state of phase Ø5 is low and the logical state of phase Ø1 is high. That occurs during the shaded region labeled "B" as illustrated in FIG. 5A. The value of the sampled serial data signal 201 at A4 that was outputted to node 405 upon activation of transmission gate 404D subsequently becomes part of the retimed_data as illustrated in FIG. 5A at the point in time at T4.

FIG. 6—Method for Reducing Timing Uncertainties in a Serial Data Signal

FIG. 6 illustrates a flowchart of one embodiment of the present invention of a method 600 for reducing timing uncertainties, i.e., jitter, in serial data signal 201. In step 601, receiver 103 (FIG. 1) may comprise a retiming mechanism 203 (FIG. 2) configured to receive serial data 201 transmitted from transmitter 101 (FIG. 1). In step 602, retiming mechanism 203 in receiver 103 may further be configured to receive phases of a clock generated from an oscillator 202 (FIG. 2) in receiver 103. In one embodiment, oscillator 202 may be configured to operate at a frequency lower than the serial data rate thereby saving power.

In step 603, serial data 201 may be sampled at various phases of the clock generated by oscillator 202 by a plurality of flip-flops 403 (FIG. 4B) in retiming mechanism 203 as described in the description of FIGS. 4A and 4B. By sampling the serial data signal 201 at various phases of the clock generated by oscillator 202, the serial data signal 201 may be sampled at points in time when the serial data signal 201 may not be likely to experience jitter as illustrated in FIG. 3. Each particular flip-flop 403 may be associated with a particular transmission gate 404 (FIG. 4B) as illustrated in FIG. 4B.

In step 604, the value of the serial data sampled by a particular flip-flop 403 at a particular phase of the clock may be outputted to become part of the retimed data if the associated transmission gate 404 is activated as described in the description of FIGS. 4A and 4B. Transmission gate 404 may be activated based upon the logical states of its inputs as determined by the combinational logic in retiming mechanism 203, e.g., plurality of NAND gates 401 and a plurality of inverters 402, as described in the description of FIGS. 4A and 4B and illustrated in FIG. 5.

It is noted that steps 601–604 in method 600 may be executed in a different order than presented and that the order presented in the discussion of FIG. 6 is illustrative. It is further noted that certain steps in steps 601–604, e.g., steps 601 and 602, may occur almost concurrently.

Although the system and method are described in connection with several embodiments, it is not intended to be limited to the specific forms set forth herein, but on the contrary, it is intended to cover such alternatives, modifications, and equivalents, as can be reasonably included within the spirit and scope of the invention as defined by the appended claims. It is noted that the headings are used only for organizational purposes and not meant to limit the scope of the description or claims.

I claim:

1. A receiver comprising:

an oscillator outputting three or more phases of a clock signal; and a retiming mechanism coupled to said oscillator having circuitry for receiving said phases of said clock signal and serial data, and circuitry operable to reduce timing uncertainties in said serial data by outputting a value of said serial data sampled at a particular phase of said clock signal;

wherein said retiming mechanism comprises a plurality of first units, wherein each of said plurality of first units comprises circuitry for sampling said serial data using a said particular phase of said clock signal;

wherein said retiming mechanism further comprises a plurality of second units, wherein each of said plurality of second units is associated with a particular first unit, wherein each of said plurality of second units comprises circuitry for outputting the value of said serial data sampled by said associated first unit upon activation;

wherein a particular second unit of said plurality of second units is activated based on a logical state of each input to said particular second unit; and wherein said logical state of each input is determined based on combinational logic using said phases of said clock signal and complements of said phases of said clock signal.

2. The receiver as recited in claim 1, wherein each of said plurality of first units comprises circuitry for receiving said particular phase of said clock signal and a complement of said particular phase of said clock signal and said serial data.

3. A system comprising:

a transmission medium;

a transmitter coupled to said transmission medium configured to convert parallel data to a serial form; and a receiver coupled to said transmission medium, wherein said receiver comprises:

an oscillator outputting three or more phases of a clock signal; and a retiming mechanism coupled to said oscillator having circuitry for receiving said phases of said clock signal and serial data, and circuitry operable to reduce timing uncertainties in said serial data by outputting a value of said serial data sampled at a particular phase of said clock signal;

wherein said retiming mechanism comprises a plurality of first units, wherein each of said plurality of first units comprises circuitry for sampling said serial data using said particular phase of said clock signal;

wherein said retiming mechanism further comprises a plurality of second units, wherein each of said plurality of second units is associated with a particular first unit, wherein each of said plurality of second units comprises circuitry for outputting the value of said serial data sampled by said associated first unit upon activation;

wherein a particular second unit of said plurality of second units is activated based on a logical state of each input to said particular second unit; and wherein said logical state of each input is determined based on combinational logic using said phases of said clock signal and complements of said phases of said clock signal.

4. The system as recited in claim 3, wherein each of said plurality of first units comprises circuitry for receiving said particular phase of said clock signal and a complement of said particular phase of said clock signal and said serial data.

* * * * *

UNITED STATES PATENT AND TRADEMARK OFFICE
CERTIFICATE OF CORRECTION

PATENT NO. : 6,963,628 B2
DATED : November 8, 2005
INVENTOR(S) : David William Boerstler It is certified that error appears in the above-identified patent and that said Letters Patent is hereby corrected as shown below:

Column 3,
Line 47, insert -- . -- after "203" and before "Reffering".

Column 7,
Line 15, delete "a".

Signed and Sealed this

Sixteenth Day of May, 2006

JON W. DUDAS
*Director of the United States Patent and Trademark Office*